United States Patent
Sage et al.

(10) Patent No.: US 8,859,922 B1
(45) Date of Patent: Oct. 14, 2014

(54) MULTI-FUNCTION SWITCH APPARATUS AND METHOD OF USE

(75) Inventors: Ian Sage, Southfield, MI (US); Tim Green, Holly, MI (US)

(73) Assignee: Method Electronics, Inc., Chicago, IL (US)

( * ) Notice: Subject to any disclaimer, the term of this patent is extended or adjusted under 35 U.S.C. 154(b) by 629 days.

(21) Appl. No.: 12/906,930

(22) Filed: Oct. 18, 2010

Related U.S. Application Data

(60) Provisional application No. 61/252,700, filed on Oct. 18, 2009.

(51) Int. Cl.
*H03K 17/975* (2006.01)

(52) U.S. Cl.
USPC ............................................. 200/600

(58) Field of Classification Search
CPC ........ G06F 3/041; G06F 3/0414; G06F 3/044
USPC ............................................. 200/600
See application file for complete search history.

(56) References Cited

U.S. PATENT DOCUMENTS

| | | | |
|---|---|---|---|
| 7,829,812 B2* | 11/2010 | Tolbert et al. | 200/600 |
| 8,110,767 B2* | 2/2012 | Yamauchi et al. | 200/600 |
| 2009/0160529 A1* | 6/2009 | Lamborghini et al. | 327/517 |

* cited by examiner

*Primary Examiner* — Renee Luebke
*Assistant Examiner* — Lheiren Mae Caroc
(74) *Attorney, Agent, or Firm* — Barnes & Thornburg LLP

(57) ABSTRACT

A multi-function switch includes a proximity sensor for detecting proximity to the switch-at-large and one or more touch sensors that can distinguish between a touch to a corresponding touch surface and a push to the touch surface.

22 Claims, 12 Drawing Sheets

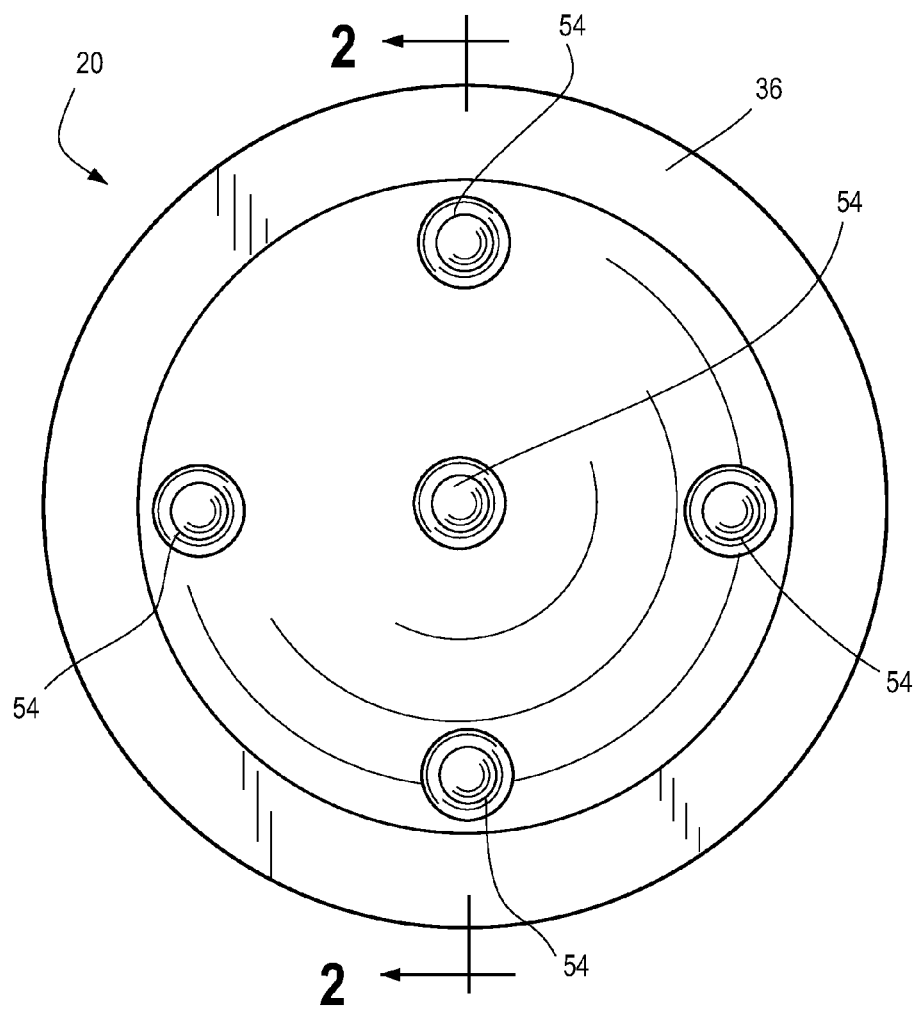

MULTI-FUNCTION SWITCH APPARATUS AND METHOD OF USE

CROSS-REFERENCE TO RELATED APPLICATIONS

This application claims priority from and incorporates by reference the disclosure of U.S. Provisional Patent Application No. 61/252,700, filed on Oct. 18, 2009.

BRIEF DESCRIPTION OF THE DRAWINGS

FIG. 1 is a plan view of an illustrative embodiment of a multi-function switch 20 including switch mat 36 having tactile structure defining five touch surfaces 54, as it typically would be seen by a user;

DETAILED DESCRIPTION OF THE DRAWINGS

Figure 2A:
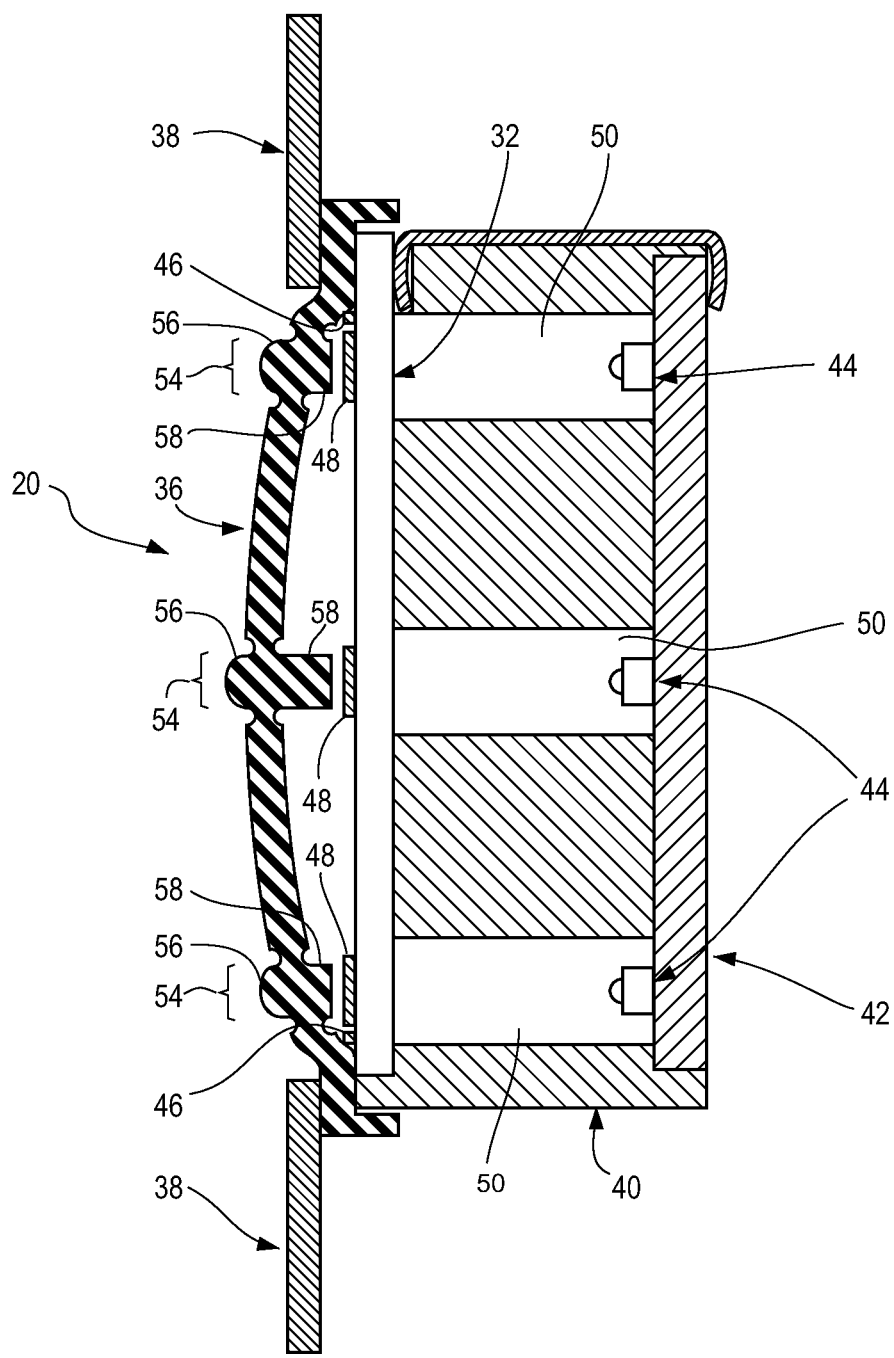
FIG. 2A is a cross-sectional view of an illustrative embodiment of a multi-function switch 20 including switch mat 36, a sensor carrier 32, a proximity sensing electrode 46 disposed on sensor carrier 32, touch sensing electrodes 48 disposed on sensor carrier 32, a portion of a housing 38, a light guide 40, a lighting carrier 42, and light emitting devices 44.

FIGS. 1-4 illustrate an embodiment of a multi-function switch 20 configured to provide separate and distinct outputs in response to proximity of a stimulus, for example, a human appendage or other conductive object, to the switch-at-large; touch of a stimulus to a particular portion of the switch; and physical displacement of the particular portion of the switch.

Switch 20 includes a proximity sensing electrode 46 disposed on a sensor carrier 32. Proximity sensing electrode 46 is coupled to a suitable control circuit that energizes and detects stimuli proximate proximity sensing electrode 46, as will be discussed further below. The control circuit can be located on sensor carrier 32 or elsewhere within switch 20. Proximity sensing electrode 46, either alone or in combination with the corresponding control circuit, may be referred to herein as a proximity sensor. Other embodiments could include more than one proximity sensing electrode.

Switch 20 also includes five touch sensing electrodes 48 disposed on sensor carrier 32. Each touch sensing electrode 48 is coupled to a suitable control circuit that energizes and detects stimuli proximate touch sensing electrode 48, as will be discussed further below. The control circuit can be located on sensor carrier 32 or elsewhere within switch 20. Each of touch sensing electrodes 48, either alone or in combination with the corresponding control circuit may be referred to herein as a touch sensor. Other embodiments could include more (as many as practical) or fewer (as few as one) than five touch sensing electrodes.

Preferably, the control circuits for all of proximity sensing electrode 46 and touch sensing electrodes 48 are embodied as an integrated controller 60 (see FIG. 4) in the form of a Cypress Semiconductor PSOC marketed by Cypress Semiconductor Corporation. Alternatively, one or more other suitable controllers or control circuits (which could be embodied in integrated circuit form or as discrete electrical components and traces) could be used, as would be understood by one skilled in the art. Typically, sensor carrier 32 would include electrical circuit traces (not shown) coupling the sensing electrodes to the control circuit(s). Sensor carrier 32 also could carry the foregoing control circuit(s). Generally, the terms "control circuit" and "controller" are used interchangeably herein. Typically, the output of controller 60 would indicate the states of the proximity and touch sensors and would be coupled to an auxiliary controller, as discussed further below.

Figure 3:
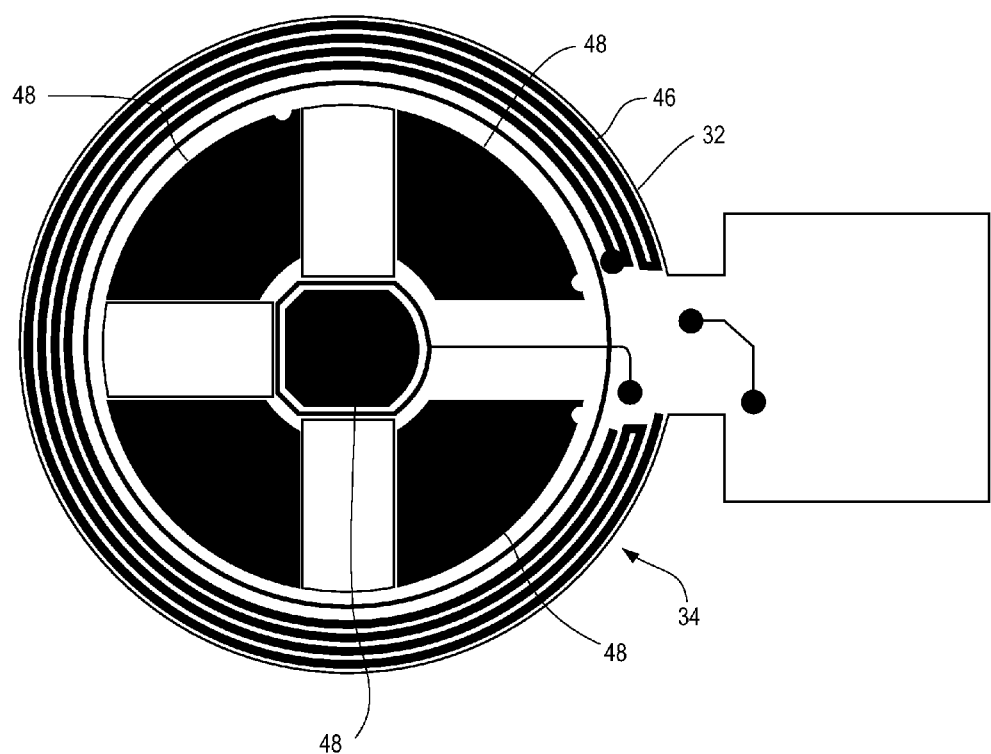
FIG. 3 is a plan view of an illustrative embodiment of a sensing electrode structure 34 including proximity sensing electrode 46 and five touch sensing electrodes 48.
Figure 4:
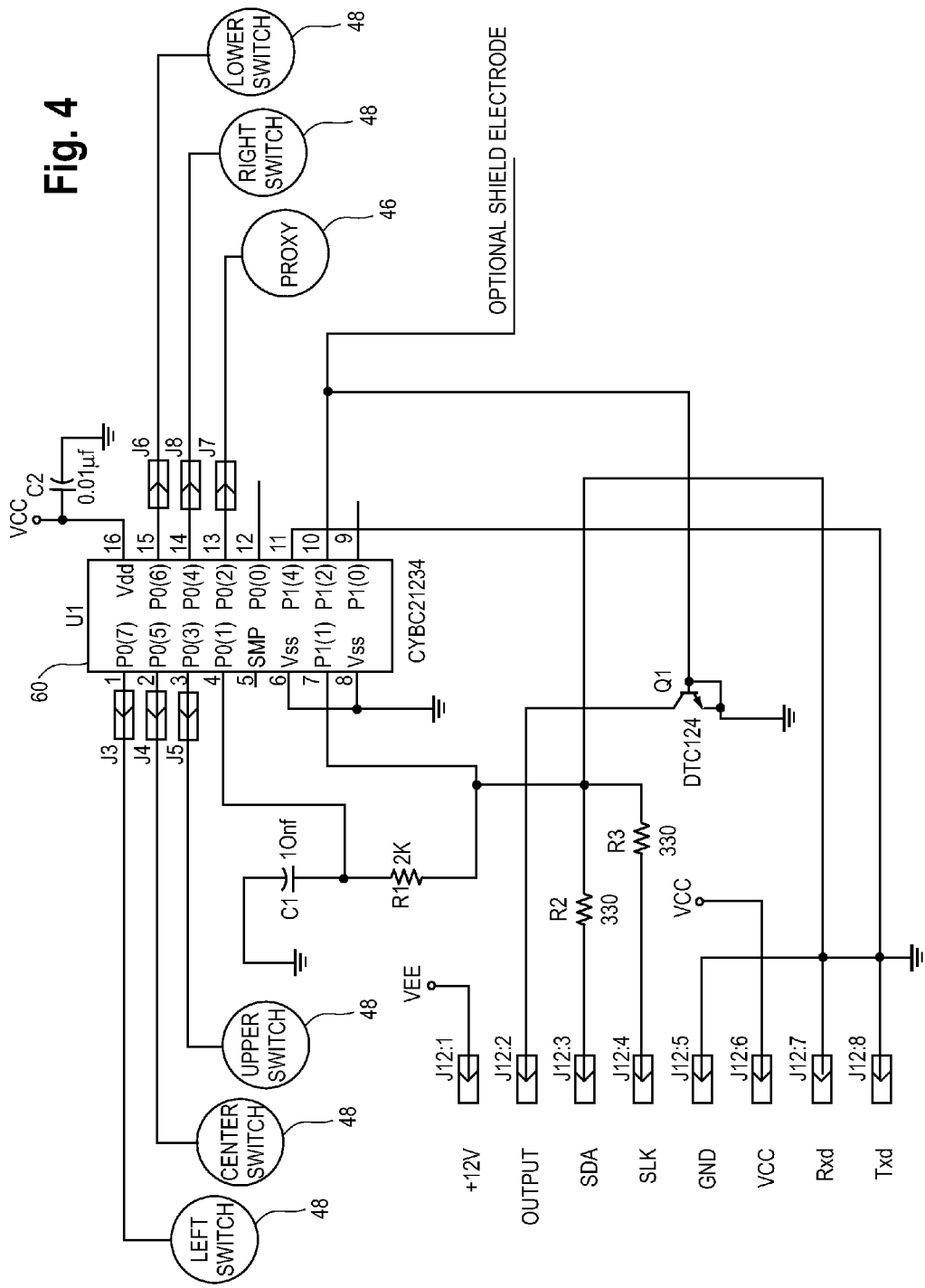
FIG. 4 is a partial schematic diagram showing a controller 60 coupled to proximity sensing electrode 46 and touch sensing electrodes 48.

The proximity and touch sensing electrodes preferably are embodied as thin conductive pads or traces made of any suitable conductive or semi-conductive material, for example, copper, silver, or indium tin oxide, as would be understood by one skilled in the art. In this regard, FIG. 3 depicts proximity sensing electrode 46 as a thin conductive trace and touch sensing electrodes 48 as thin conductive pads. The sensing electrodes could be embodied in other forms, as would be understood by one skilled in the art. Preferably, the sensing electrodes are sized to readily allow reliable sensing of an intended stimulus, for example, a hand, finger, or other conductive object.

Preferably, all of the foregoing proximity and touch sensing electrodes are disposed on the side of sensor carrier 32 facing switch mat 36, as will be discussed below. In other embodiments, any or all of these proximity and touch sensing electrodes could be disposed on the other side of sensor carrier 32.

Sensor carrier 32 can be embodied as a printed wiring board, flexible circuit carrier, a glass or plastic substrate, or any other medium suitable for bearing sensing electrodes and electrical circuit components, as would be understood by one skilled in the art. Sensor carrier 32 could include a flexible tail and/or be coupled to a wiring harness or other structure to facilitate coupling of the sensing electrodes and/or other components thereon to other electrical circuits or controllers.

A switch mat 36 is disposed above sensor carrier 32. Switch mat 36 defines five touch surfaces 54 on the outer surface thereof. Touch surfaces 54 correspond, respectively, to touch sensing electrodes 48 and generally are spatially aligned therewith. Each touch surface 54 is further defined by tactile structure in the form of a bump 56. In other embodiments, switch mat 36 could include other tactile and/or visual features as indicators of the touch sensor locations. For example, switch mat 36 could include depressions, bezels, decorations, and the like instead of, or in addition to, bumps 56. These tactile and/or visual features could be integrally formed with switch mat 36 or applied thereto using adhesives, printing techniques, overlays, and the like. In some embodiments, switch mat 36 could be devoid of such tactile and/or visual features.

Optional projections 58 depend from the inner surface of switch mat 36 opposite touch surfaces 54. Projections 58 correspond, respectively to touch sensing electrodes 48 and touch surfaces 54 and generally are spatially aligned therewith.

Figure 2B:
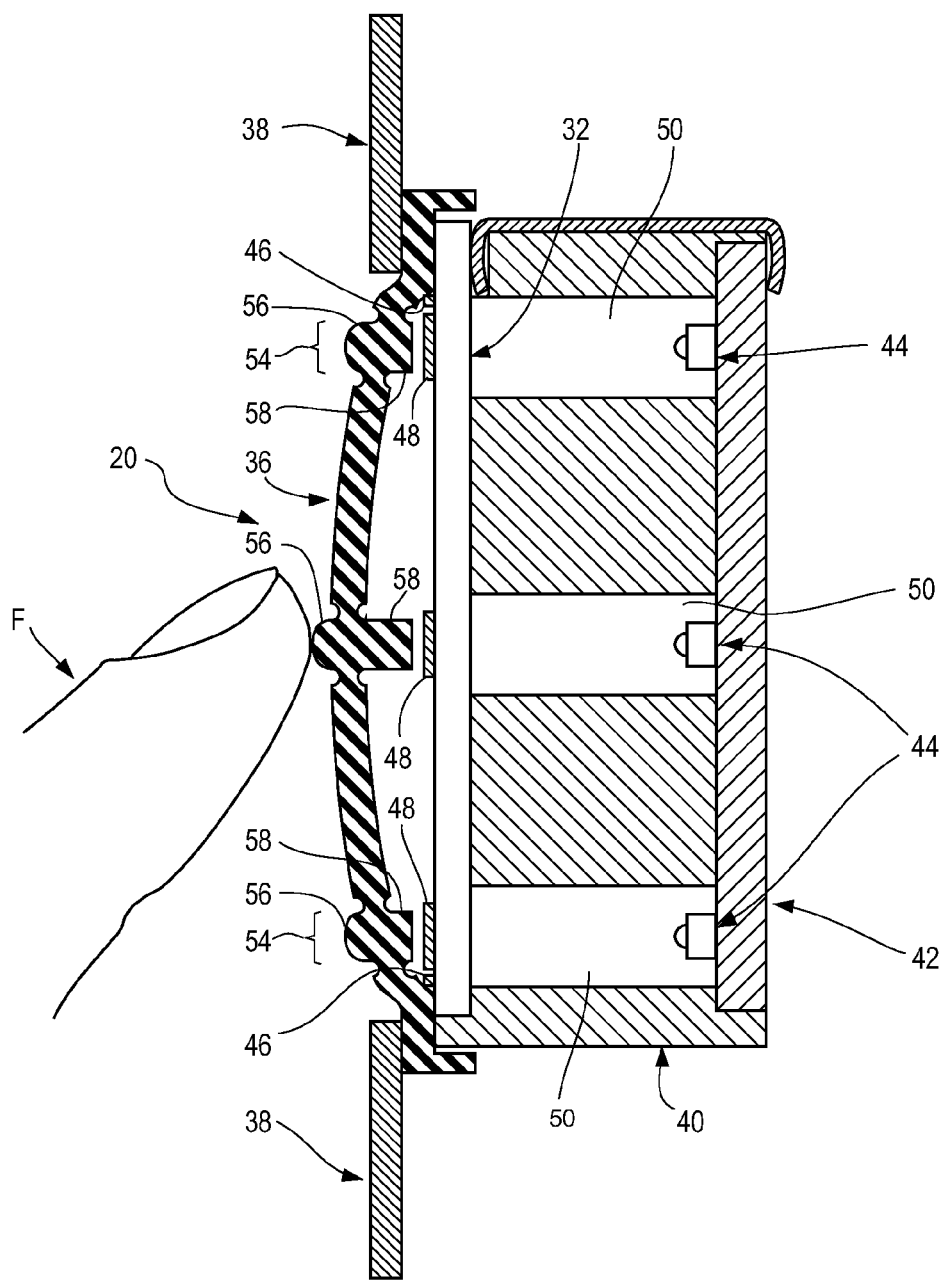
FIG. 2B is similar to FIG. 2A but shows a stimulus in the form of a human finger F touching a touch surface 54.
Figure 2C:
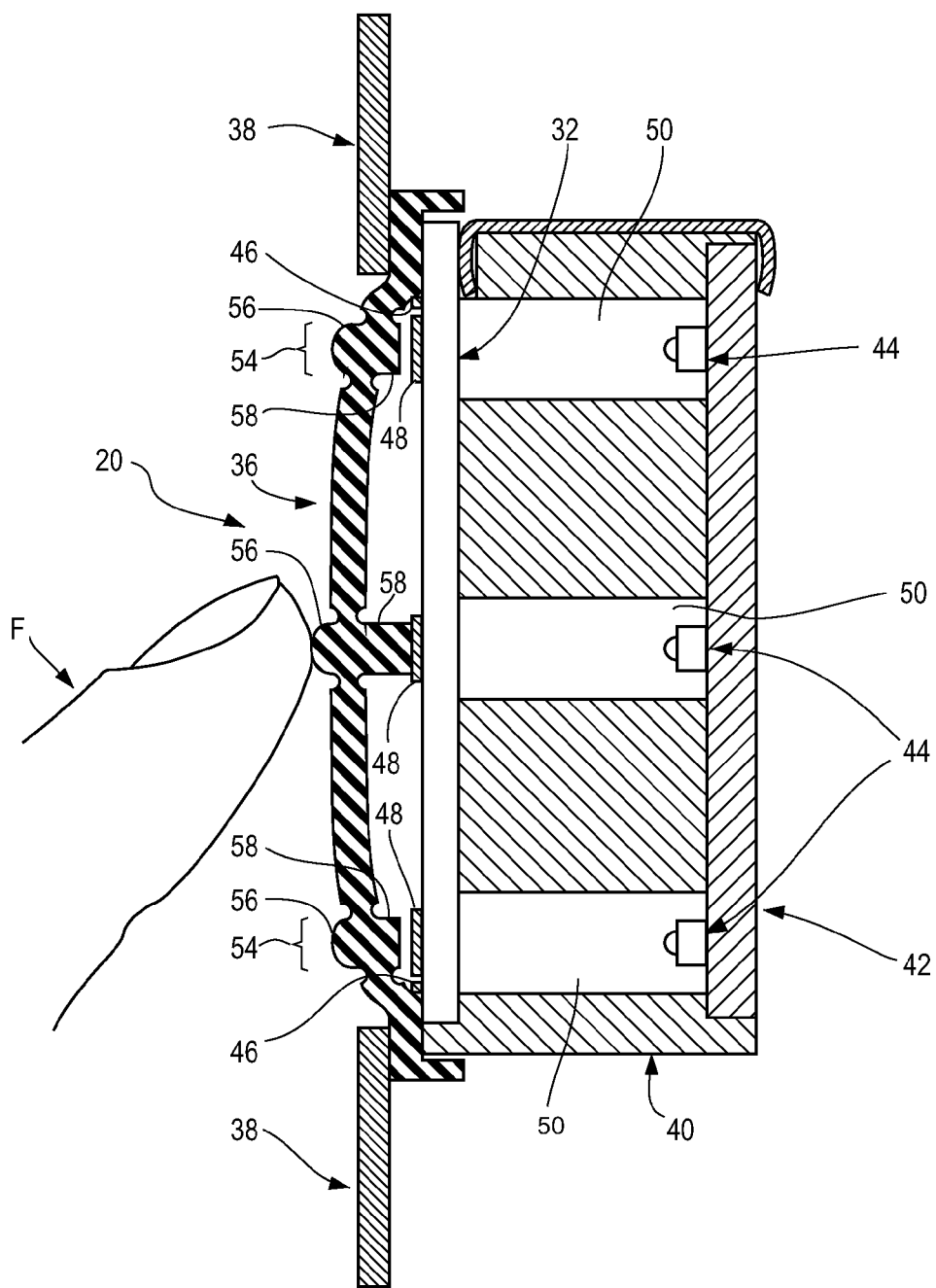
FIG. 2C is similar to FIG. 2B but shows a stimulus in the form of a human finger F depressing a touch surface 54.

Switch mat 36 preferably is made of a flexible, compressible, and/or resilient, non-conductive material, for example, a compressible rubber material, enabling displacement of touch surfaces 54 closer to touch sensing electrodes 48 in response to pressure applied to switch mat 36, as shown in FIG. 2C and as will be discussed further below. Preferably, switch mat 36 is made of a single, continuous sheet of material and is assembled to switch 20 in a manner that mitigates intrusion of liquid and/or solid contaminants into the internals of switch 20.

Light emitting devices 44 corresponding, respectively, to touch sensing electrodes 48 and touch surfaces 54 are disposed on a lighting carrier 42. Light emitting devices 44 can be embodied as LEDs, OLEDs, PLEDS, lamps, and the like, as would be recognized by one skilled in the art.

Light emitting devices 44 preferably are electrically coupled to a suitable, auxiliary control circuit, as mentioned above and discussed further below, by way of electrical circuit traces disposed on lighting carrier 42. A flexible tail, wiring harness, and/or other structure can be provided, as well, to facilitate the foregoing coupling. In some embodiments, controller 60 and the foregoing auxiliary control circuit could be integrated with each other.

Lighting carrier 42 is attached to or otherwise associated with a first surface of a light guide 40. Sensor carrier 32 is attached to or otherwise associated with a second surface of light guide 40. Light guide 40 defines five optical paths 50. Each optical path 50 corresponds to and generally aligns with a respective light emitting device 44, touch sensing electrode 48, and touch surface 54.

Light guide 40 could be made of any material suitable for guiding light from light emitting devices 44 to the first side of light guide 40. Preferably, though not necessarily, light guide 40 would be made of a highly reflective material that inhibits transmission of light there through. Additionally or alternatively, interior surfaces of optical paths 50 could be coated or sleeved with a reflective material to further this functionality.

In other embodiments, light emitting devices 44 could be disposed on or otherwise associated directly with sensor carrier 32. In such embodiments, lighting carrier 42 and light guide 40 could be omitted. Also, in such embodiments, reflectors (not shown) could be associated with light emitting devices 44 and/or sensor carrier 32 to direct light emanating from light emitting devices 44 as desired.

In order that lighting emanating from light emitting devices 44 may be visible at touch surfaces 54, at least relevant portions of sensor carrier 32, touch sensing electrodes 48, and switch mat 36 should be made of a material that is transparent or translucent, as would be understood by one skilled in the art. Such transparent or translucent portions could be shaped to define decorative or functional indicia when backlit. For example, switch mat 36 could include transparent or translucent portions proximate touch surfaces 54 configured to define words, numbers, or symbols when the corresponding light emitting device 44 is energized.

In some embodiments, it might be desirable to not provide backlighting for certain touch surfaces 54. In such embodiments, the corresponding light emitting devices 44 and/or optical paths 50 could be omitted. In other embodiments, it might be desirable to not provide backlighting for any portion of switch mat 36. In such embodiments, light emitting devices 44, lighting carrier 42 and light guide 40 could be omitted altogether.

The foregoing components can be contained by a housing 38 (for clarity, only a trim bezel portion of housing 38 is shown in the drawings). Switch 20 typically would also include a pig tail or connector (not shown) to facilitate electrical connection of switch 20 to a wiring harness, communications bus, controlled device, or the like.

Housing 28 can include mounting features, for example, tabs, brackets, snap features, interference fit features, and the like, to facilitate mechanical connection of switch 20 to a panel or other structure.

Although switch 20 is shown as having a generally round face and cylindrical overall structure, it could have any other suitable configuration, for example, ovoid or rectangular, and proximity sensing electrode 46 and touch sensing electrodes 48 could be arranged thereon in any suitable manner.

Additional light emitting devices 44 could be provided to backlight portions of switch mat 36 other than touch surfaces 54. In such embodiments, relevant portions of sensor carrier 32, switch mat 36, and other intervening structure (for example, proximity sensing electrode 46) between the additional light emitting device and switch mat 36 should be transparent or translucent.

In use, controller 60 generates and provides signals to each of proximity sensing electrode 46 and touch sensing electrodes 48. These signals establish a capacitance between each of the sensing electrodes and ground. In the absence of a stimulus proximate the sensing electrodes, each of these capacitances would be at or about some baseline level. Introduction of a stimulus proximate any of the sensing electrodes causes the corresponding capacitance to change. Controller 60 detects these changes. When any of the changes in capacitance exceeds a predetermined threshold level (or exceeds a predetermined threshold level for at least a predetermined amount of time), controller 60 outputs a signal indicative thereof according to a suitable algorithm. One such algorithm is discussed further below.

For example, controller 60 could be configured to provide a signal to proximity sensing electrode 46 thereby establishing a baseline capacitance at proximity sensing electrode 46. Introduction of a stimulus, for example, a human hand, finger, or other conductive object, in the vicinity of proximity sensing electrode 46 changes this capacitance. The magnitude of the change typically increases as the stimulus moves nearer to the electrode.

When the magnitude of the change exceeds a predetermined threshold level (or exceeds a predetermined threshold level for at least a predetermined amount of time), controller 60 could output a signal indicative thereof. Preferably, the threshold level of change in capacitance would be exceeded when the stimulus moves to within a predetermined distance of switch mat 36 (a "proximity event"). Preferably, the proximity event threshold would be set so as to not require actual touch of the stimulus to switch mat 36.

Also, controller 60 could be configured to provide signals to each of touch sensing electrodes 48, thereby establishing a baseline capacitance at each of touch sensing electrodes 48. Introduction of a stimulus, for example, a human finger or other conductive object, in the vicinity of any of touch sensing electrodes 48 changes the corresponding capacitance. The magnitude of the change typically increases as the stimulus moves nearer to the electrode.

When the magnitude of the change exceeds a first predetermined threshold level (or exceeds a first predetermined threshold level for at least a predetermined amount of time) (a "touch event" or the "touched state"), controller 60 could output a signal indicative thereof. Preferably, the touched state would be achieved when the stimulus lightly touches a corresponding touch surface 54, as shown in FIG. 2B, but does not displace the touch surface toward the corresponding electrode, as shown in FIG. 2C.

Further, when the magnitude of the change exceeds a second predetermined threshold level (or exceeds a second predetermined threshold level for at least a predetermined amount of time) (a "push event" or the "pushed state), controller 60 could output a signal indicative thereof. Preferably, the pushed state would be achieved when the stimulus displaces a corresponding touch surface 54 toward the corresponding touch sensing electrode 48, as shown in FIG. 2C, but not when the stimulus merely touches the touch surface 54, as shown in FIG. 2B.

The foregoing output signals could be provided to an auxiliary controller that could be configured to cause light emitting devices 44 to be selectively illuminated, for example, as shown in Table 1, thereby selectively backlighting the corresponding touch surfaces 54. (Alternatively, this functionality could reside within controller 60.)

TABLE 1

| Controller 60 Output Status | Light Emitting Device 44 Status |
| --- | --- |
| No stimulus proximate switch 20 | All on |
| No stimulus proximate switch 20 | All off |
| Stimulus proximate switch 20 | All on |
| Stimulus touching particular touch surface 54 | Corresponding light emitting device on, all others off |
| Stimulus touching particular touch surface 54 | Corresponding light emitting device on, all others on at different (greater or lesser) intensity |
| Stimulus displacing particular touch surface 54 | Corresponding light emitting device on, all others off |
| Stimulus displacing particular touch surface 54 | Corresponding light emitting device on, all others on at different (greater or lesser) intensity |

In other embodiments, a plurality of light emitting devices (not shown) having different colors could replace each of light emitting devices 44. In such embodiments, the auxiliary controller could cause different ones of a particular plurality of such light emitting devices to be illuminated in response to a proximity event, a touch event, or a push event, thereby providing different colors of backlighting at touch surfaces 54.

The auxiliary controller also could control one or more remote or external displays. For example, the auxiliary controller could cause icons on an automobile instrument panel corresponding to the functions controlled by switch 20 to become selectively illuminated in response to a proximity event, a touch event, or a push event (any of which might be referred to as an "actuation event"), in a manner similar to light emitting devices 44.

Further, the auxiliary controller could cause the functions controlled by switch 20 to be actuated in response to a touch event or push event at the touch surfaces 54 corresponding to those functions. In an automotive application, such functions could include HVAC control, window control, seat control, radio control, etc. In other applications, such functions could include appliance control, entertainment system control, or other equipment control.

Figure 5A:
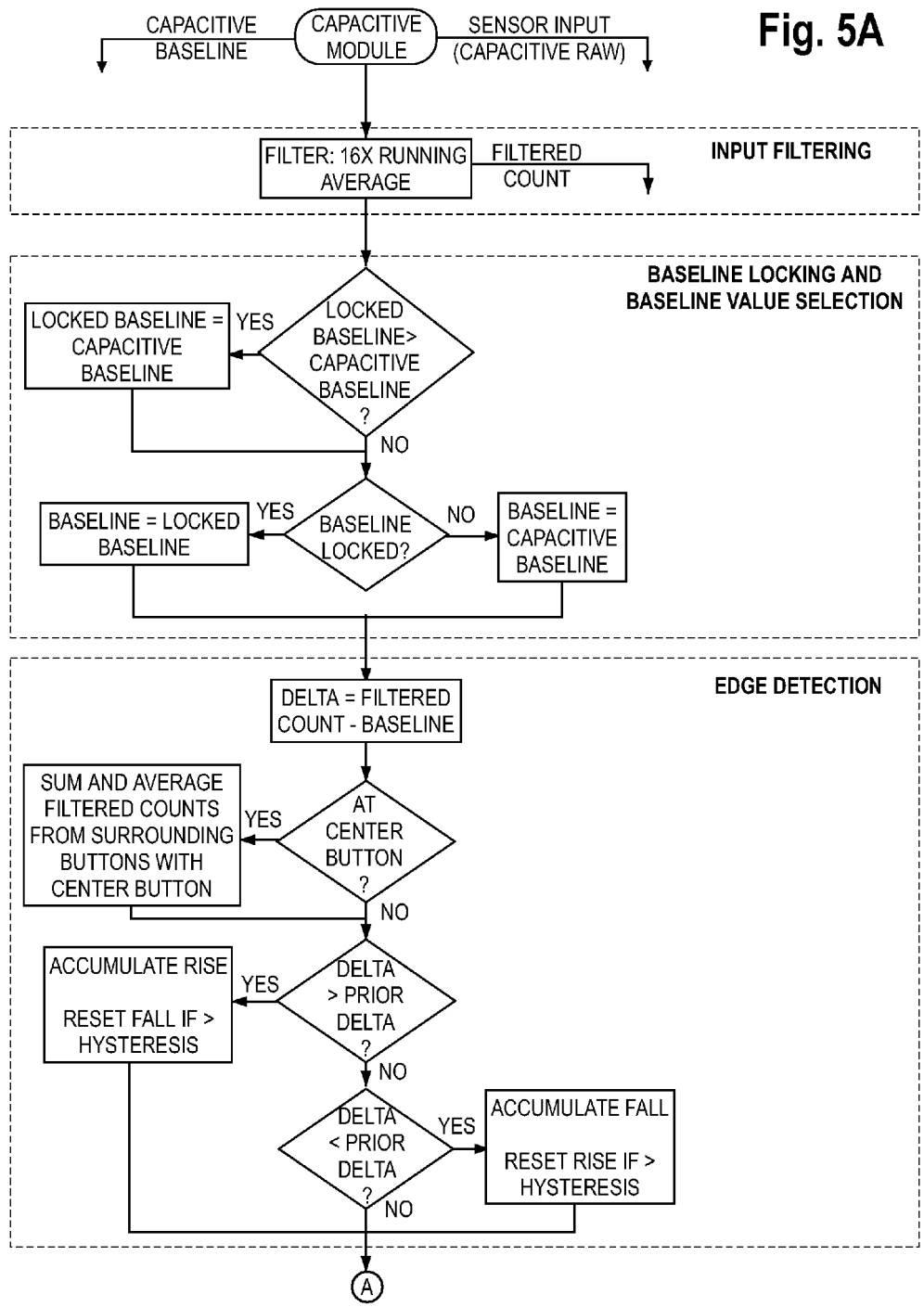
FIG. 5A is a portion of a flow chart showing an illustrative algorithm for operating switch 20.
Figure 5A:
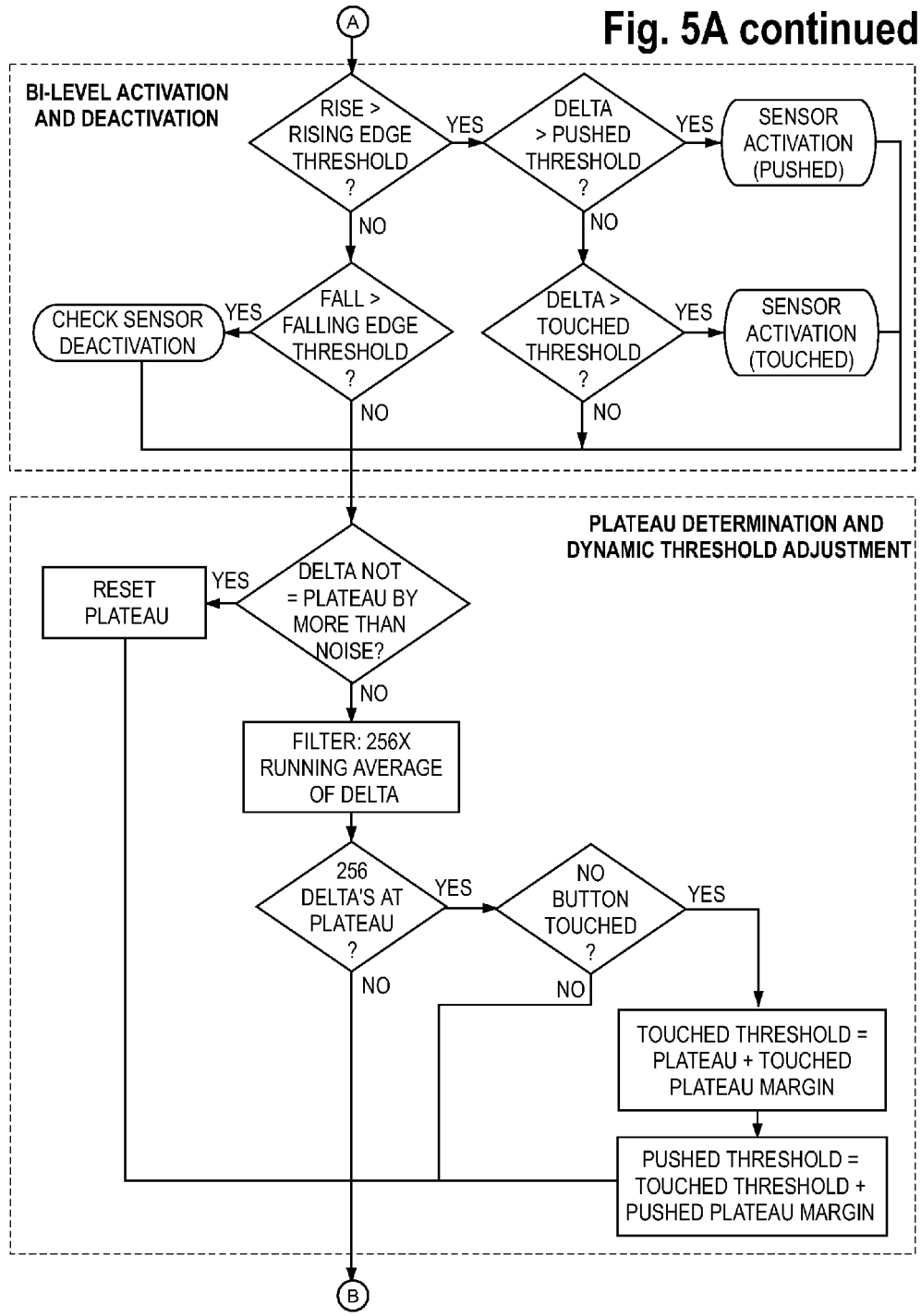
Figure 5A:
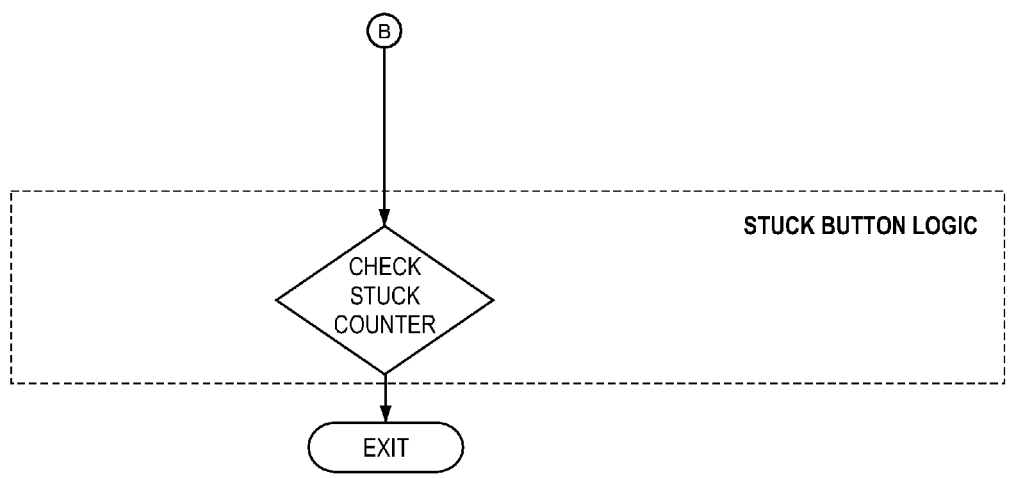
Figure 5B:
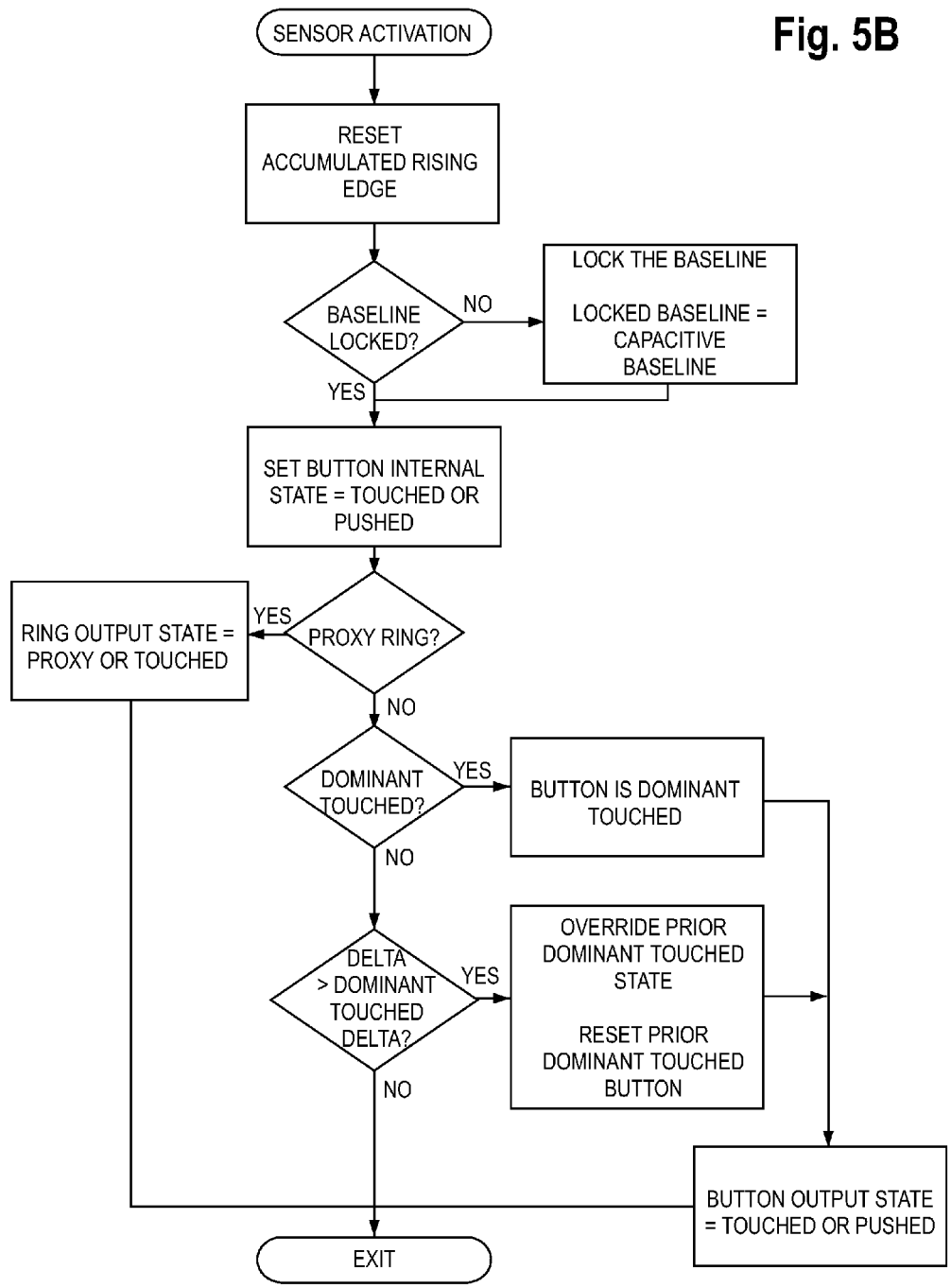
FIG. 5B is a portion of a flow chart showing an illustrative algorithm for operating switch 20.
Figure 5C:
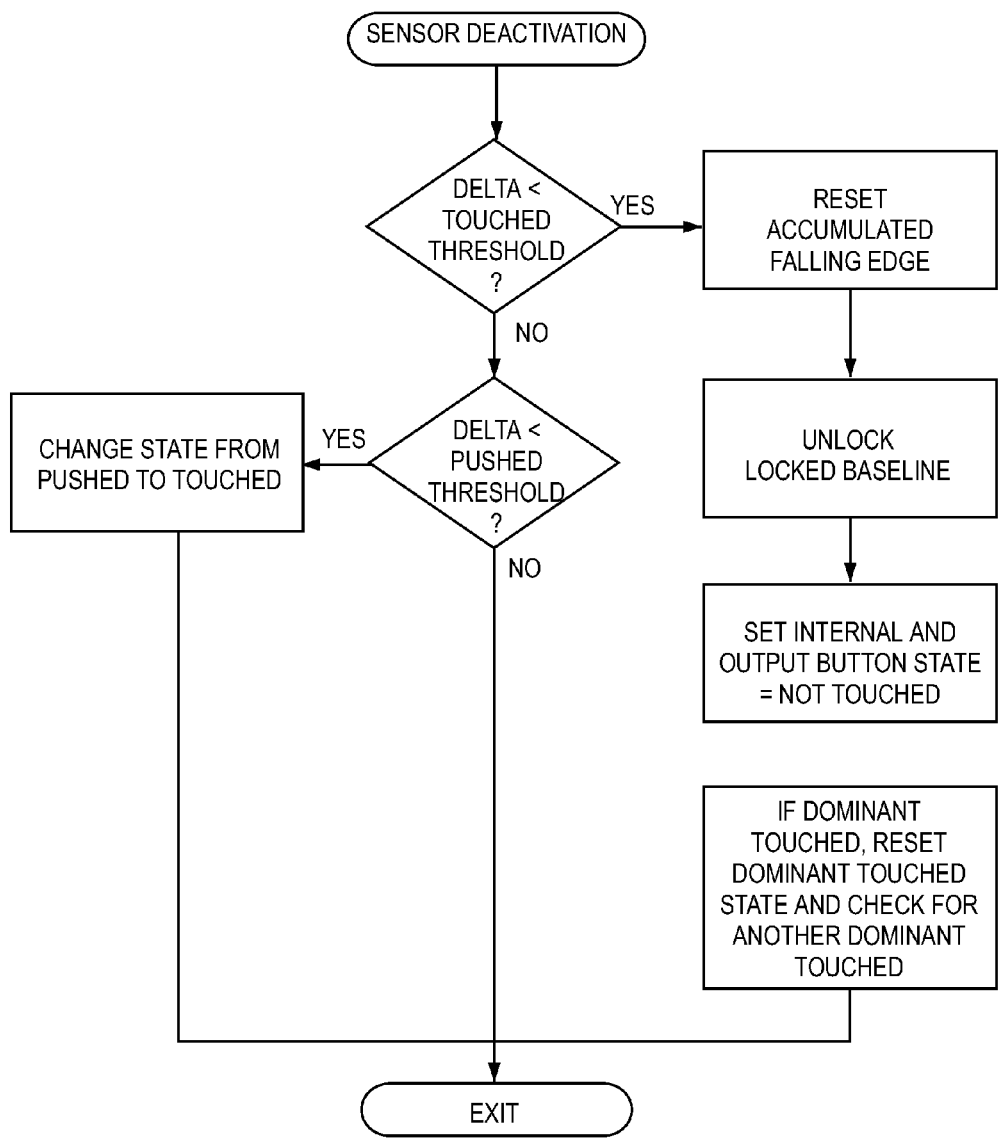
FIG. 5C is a portion of a flow chart showing an illustrative algorithm for operating switch 20.

FIGS. 5A, 5B and 5C illustrate an embodiment of an algorithm for operating switch 20. This algorithm could be implemented in hardware form or as software programmed into controller 60. Generally, the algorithm uses capacitive measurements, as will be discussed further below, to determine whether or not a stimulus is present in the vicinity of proximity sensing electrode 46, whether or not a stimulus is in contact with the touch surface 54 corresponding to a specific one of touch sensing electrodes 48, and whether or not a stimulus is displacing the touch surface 54 corresponding to a specific one of touch sensing electrodes 48.

The capacitive module shown in FIG. 5A represents, for example, hardware or software that processes signal received from the sensing electrodes and provides outputs indicative of the capacitances at the electrodes. The capacitive module preferably samples the capacitance at the sensing electrodes as frequently as possible, for example, every 5 milliseconds or so.

For each sensing electrode, the capacitive module determines a capacitive baseline value and a capacitive raw value. The capacitive baseline value corresponds to the electrode's at-rest/steady-state capacitance (that is, the electrode's capacitance with no stimulus proximate the electrode). The capacitive raw value corresponds to the electrode's real-time capacitance. In the absence of a stimulus proximate the sensing electrode, the capacitive raw value may correspond to the capacitive baseline value. With a stimulus present proximate the electrode, the capacitive raw value typically would be higher than the capacitive baseline value. The delta value, as will be discussed further below, is the difference between the capacitive raw value and the capacitive baseline value.

As would be understood by one skilled in the art, the sensing electrodes' steady-state capacitances can vary over time during operation of switch 20. These variations can be caused by, for example the effects of, or changes in, temperature and humidity. They also can be caused by materials or objects that are not the stimuli that are intended to be sensed but that might be placed about switch 20 and thereby affect the electrodes' capacitances. To compensate for these changes in steady-state capacitance, the capacitive baseline value for each sensing electrode preferably is dynamically adjusted, as would be understood by one skilled in the art.

Dynamic adjustment of the capacitive baseline, however, could adversely affect operation of switch 20 if the dynamic adjustment were to occur with a stimulus present in the vicinity of switch 20. Under such circumstances, the dynamic adjustment routine could inappropriately adjust the capacitive baseline value to a capacitive raw value resulting from proximity of the stimulus to the electrode. If this were to occur, subsequent processing dependent on an accurate capacitive baseline value could be adversely affected such that the algorithm could fail properly determine whether an actuation event has occurred.

In order to mitigate this concern, the algorithm preferably implements a baseline locking routine. According to this baseline locking routine, the initial capacitive baseline determined during the evaluation of a particular sensor's actuation status is stored as the locked baseline for the duration of that evaluation. The locked baseline is used in the delta calculation for the remainder of that evaluation (during which time numerous delta calculations might be made, depending on the capacitive raw value sampling rate).

When a sensor is deemed not to be actuated, the capacitive baseline can be, and preferably is, unlocked, thereby enabling further dynamic adjustment of the capacitive baseline. The unlocked capacitive baseline could be, and preferably would be, the initial capacitive baseline used in the delta calculation in subsequent evaluations.

In some embodiments, switch 20 can include a number of touch surfaces 54 in close proximity to each other, such that a stimulus directed to a particular touch surface 54 could affect the capacitive raw value of the sensing electrodes corresponding to the adjacent touch surfaces 54. This, in turn, could affect the capacitive baselines of the corresponding adjacent sensors. For example, with reference to FIG. 1, a finger touching or pushing the center touch surface 54 necessarily is near the four adjacent touch surfaces 54 and, therefore, is likely to affect the capacitive baseline values of the touch sensors corresponding to the adjacent touch surfaces 54. In order to mitigate such effects, the capacitive baselines corresponding to the adjacent touch sensors could be locked in response to a touch event at the center touch surface.

As set forth above, the capacitive raw value is obtained by sampling the real-time capacitance at the electrode. The signals providing the capacitive raw value typically are noisy signals with significant variation from sample to sample, as would be understood by one skilled in the art. The algorithm preferably implements a running average filter to reduce the influence of noise on subsequent calculations. This filtering could be based on running average of any practical number of samples, for example sixteen samples.

As mentioned above, the delta value represents the difference between the capacitive baseline value (or locked capacitive baseline) and capacitive raw value (preferably the filtered capacitive raw value). As described further below, increases and decreases in the delta value over time are used in determining whether a whether or not an actuation event has occurred. These increases and decreases in the delta value (also referred to herein as "rises" and "falls") can accumulate over multiple capacitance sampling cycles because the physical effects precipitating the underlying increases and decreases to the capacitive raw values might not be confined to a single sampling cycle. Increases in the delta value (also referred to as "rising edge events") are indicative of a stimulus being introduced proximate a sensing electrode, and decreases in the delta value (also referred to as "falling edge events") are indicative of a stimulus being removed from proximity to a sensing electrode.

As mentioned above, introduction of a stimulus to the center electrode of the FIGS. 1-4 embodiment likely will affect the capacitive raw values at each of the adjacent sensors. When evaluating whether an edge event has occurred at the center sensor of the FIGS. 1-4 embodiment, the algorithm can consider the capacitive raw values at the adjacent sensors by summing and averaging the filtered count (that is, the filtered capacitive raw values) for each those sensors with the filtered count for the center sensor.

Each sensor (that is, a sensing electrode or a sensing electrode and corresponding control circuit) has a defined noise threshold, sometimes referred to as "hysteresis." This noise threshold is a value associated with the residual noise in the input signal, that is, a variation in the input signal that is not completely removed by the foregoing filtering. The noise itself generally is attributed to the capacitance measuring method. The noise threshold provides an indication of how much the signal value must change before some action is taken in response to the change. When the accumulated rise value is greater than the noise threshold, the accumulated fall value is reset to zero. When the accumulated fall value is greater than the noise threshold, the accumulated rise value is reset to zero.

Each sensor has a defined rise threshold constant. An accumulated rise value greater than the rise threshold constant indicates that a rising edge event has occurred. Each sensor also has a defined fall threshold constant. An accumulated fall value greater than the fall threshold constant indicates that a falling edge event has occurred.

Figure 6:
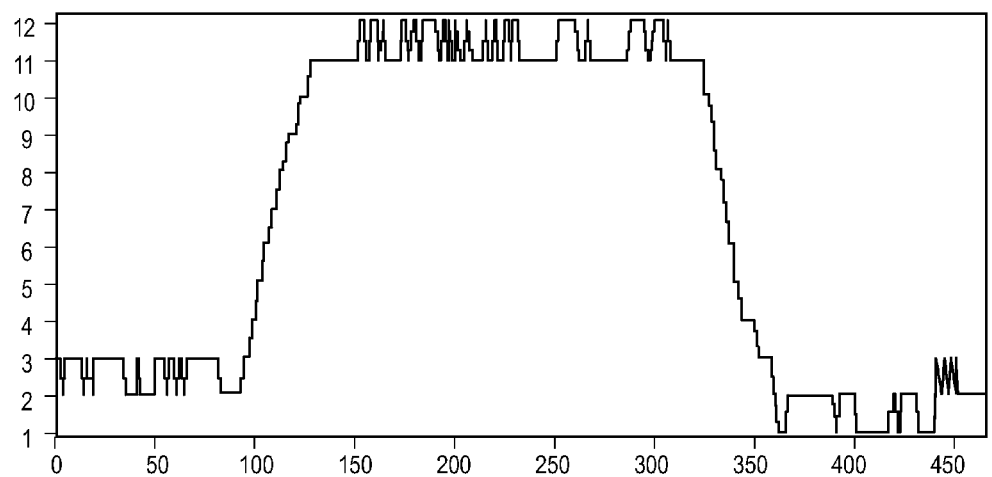
FIG. 6 is a graph of change in electrode capacitance versus sampling period.

When a stimulus is introduced near, or removed from the proximity of, an electrode, the delta value tends to increase or decrease relatively rapidly. Under these conditions, the accumulated rise or fall values exceed the rise/fall thresholds such that a rising edge or falling edge event is detected. This phenomenon is illustrated in FIG. 6. More particularly, FIG. 6 shows a delta value that is stable at the 2-3 level and that then increases in a continuous manner to the 11-12 level. Because the rise is continuous, the accumulated rise value is 9. If this accumulated rise value is greater than the rise threshold constant (which, in this example, it is deemed to be), a rising edge event is deemed to have occurred. A falling edge event is evaluated in a similar manner. The occurrence of a rising edge event is indicative of the occurrence of an actuation event, and the occurrence of a falling edge event is indicative of the termination of an actuation event.

Figure 7:
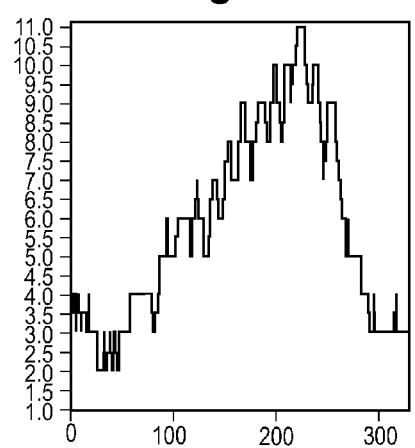
FIG. 7 is another graph of change in electrode capacitance versus sampling period.

Under certain conditions, particularly steady state conditions, the delta value might increase and decrease more slowly. Under these conditions, the delta value tends to include random variations that are greater than the noise threshold. These fluctuations cause the accumulated rise and fall values to be held at or near zero. This phenomenon is illustrated in FIG. 7. More particularly, FIG. 7 shows an increase in the delta value of a total magnitude similar to that shown in FIG. 6, but which would not be deemed to be a rising edge event because no part of the signal increases in a continuous manner long enough to permit the accumulated rise value to exceed the rise threshold constant.

The foregoing constants and thresholds are tunable and can be adjusted for each sensor and for the overall system as desired.

Each touch sensor (that is, each touch sensing electrode 48 and corresponding control circuit) has a pushed threshold value and a touched threshold value. The pushed threshold value is the value the accumulated rise value must exceed in order to indicate a pushed event. The touched threshold value is the value the accumulated rise value must exceed in order to indicate a touched event. The pushed and touched threshold values are stored in RAM and may be adjusted during plateau events. Their initial values are set from defined constants. The pushed threshold value always is greater than the touched threshold value.

When a rising edge event occurs, the delta value is first compared to the pushed threshold value. If the delta value is greater than the pushed threshold value, a sensor activation subroutine is performed and the sensor's state is set to "pushed." If the delta value is not greater than the pushed threshold value, the delta value is compared to the touched threshold value. If the delta value is greater than the touched threshold value, the sensor activation process is performed and the sensor's state is set to "touched."

In the sensor activation subroutine, the algorithm preferably locks the capacitive baseline for the sensor being evaluated if the baseline is not already locked.

If the proximity sensor is deemed to be actuated, its state is set as "proxy" or "touched," indicative of a stimulus in proximity to switch 20. If the proximity sensor is not deemed to be actuated, its state is set as "not touched." If a touch sensor is deemed to be touched, its state is set as "touched." If it is deemed to be pushed, its state is set as "pushed." If it is deemed not to be actuated, its state is set as "not touched."

In some embodiments, the touch sensors could further have a proximity threshold in addition to the foregoing "touched" and "pushed" thresholds and have a corresponding third output state, namely, "proxy." In such an embodiment, if the delta value for any touch sensor does not exceed the touched threshold during a rising edge event, but it does exceed the proximity threshold, the algorithm could determine that a stimulus is proximate, but not touching the corresponding touch surface, and the sensor's state could be set to "proxy." In such an embodiment, proximity sensor 46 could be omitted.

The algorithm provides that switch 20 can determine the state of any or all of the touch sensors at the same time but that switch 20 can only output the state of one of the touch sensors at any given time. In order to determine which sensor's state is to be output, the sensor activation subroutine determines which sensor is dominant. Switch 20 can then output the state of the dominant sensor.

Initially, with no sensor actuated, no sensor is dominant. Once a particular touch sensor is deemed to be actuated (that is, in the touched state or the pushed state), it becomes the dominant sensor and its state can be output by switch 20. If the delta value for another sensor is deemed to be greater than the delta value for the dominant sensor, the sensor with the higher delta value becomes the new dominant sensor.

Alternatively, if more than one sensor is deemed to be actuated at any given time, the sensor that was deemed to have been actuated first typically becomes and/or remains the dominant sensor until it no longer is actuated. The sensor that was next actuated becomes the new dominant sensor and remains the dominant sensor until it no longer is actuated.

When a falling edge event occurs, a sensor deactivation process is performed in which the delta value is first compared to the touched threshold. If the delta value is less than the touched threshold, the accumulated falling edge is reset, the capacitive baseline is unlocked (if it was locked), and the sensor's state is set to "not-touched." If the delta value is not less than the touched threshold, the delta value is compared to the pushed threshold. If the delta value is less than the pushed threshold, the sensor's state is changed from "pushed" to "touched."

If this sensor was previously the dominant sensor, the states of the other sensors are checked to determine first whether any such sensor is in the pushed state and second whether any such sensor is in the touched state. If multiple sensors are deemed to be in the pushed or touched state, the sensor with the greatest delta value is selected to become the dominant sensor, and the state of this sensor is output.

The algorithm can dynamically adjust the touched and pushed thresholds using a plateau determination and dynamic threshold adjustment routine. The algorithm determines that a plateau event has occurred when the delta value for a particular sensor has not changed by more than a predetermined amount over a predetermined number of sampling cycles. Preferably, a 256 cycle running average is used for this purpose. The predetermined amount of change could be equal to the sensor's noise threshold constant as set forth above, or it could be another value.

When a plateau event occurs, the sensor's touched and pushed threshold values can be adjusted. This adjustment is performed only when the sensor is in the non-touched state. A predetermined touch margin constant, that is, a value representing how much higher than the plateau the delta value must be for a sensor to be judged to be in the touched state, is added to the plateau average value to calculate the new touched threshold value. A predetermined pushed margin constant, that is, a value representing how much higher than the touched threshold the delta value must be for a sensor to be judged to be in the pushed state, is added to the new touched threshold value to calculate the new pushed threshold value A button can become "stuck" if there is a significant and long-term or permanent increase in the measured raw capacitance. This condition could be the result of switch mat 36 becoming stuck in a deflected or compressed state. This condition also could result from foreign material, for example, a contaminant or an object not intended to act as a stimulus (for example, a map propped up against the sensor panel), being introduced proximate the sensor.

During a plateau event, if the sensor's capacitive baseline is locked, the locked baseline and the capacitive baseline are compared and the locked baseline is incremented or decremented to adjust the locked baseline to be closer to the capacitive baseline. Over time, this will cause the delta value of a sensor which is stuck in, for example, the touched or pushed state to decrease until the sensor state becomes non-touched.

The algorithm also can include a timer to limit the amount of time any sensor can remain in the touched or pushed state.

Switch 20 has thus far been described as using capacitive sensing technology. In other embodiments, switch 20 could use other sensing technologies instead of or in addition to capacitive technology. For example, switch 20 could use field effect sensors, inductive sensors, or force sensing resistive sensors.

In one such embodiment, the proximity sensor could be embodied as a field effect sensor including one or more sensing electrodes coupled to a TS100 control circuit marketed by TouchSensor Technologies, LLC of Wheaton, Ill. Each touch sensor could be embodied as a pair of such field effect sensors, one configured to sense a touch to a corresponding touch surface 54 and the other configured to sense displacement of the touch surface.

Another such embodiment could combine capacitive sensing with force resistive sensing. Capacitive sensing could be used to sense proximity to switch 20 and touch surfaces 54, and a force resistive sensor could be used to detect a push to touch surface 54. The force resistive sensor could be directly above or beneath the capacitive sensing electrodes. A force resistive sensor changes resistance in response to pressure applied to the sensor. This change could be used to detect a push to touch surface 54. This combination of technologies could allow the use of a thinner switch mat 36. Although the switch mat preferably would be flexible, it would not need to be compressible.

Yet another such embodiment could combine capacitive sensing with inductive sensing. Capacitive sensing could be used to sense proximity to switch 20 and touch surfaces 54, and inductive sensing could be used to detect a push to touch surface 54. Inductive sensing can use a flat inductive coil to on the surface of a circuit carrier to sense deflection of a conductive sheet or target spaced above the coil. The inductive coil also could be used to detect light touch to the touch surface, but some displacement of the touch surface probably would be required to achieve such detection.

Haptic feedback could be provided to provide verification that a function has been performed and/or to provide indication of what function has been performed.

In some embodiments, the dedicated proximity sensor could be omitted and switch 20 could be "live" at all times. Alternatively, the proximity sensor could be omitted and any or all of the touch sensors could be configured to detect proximity events in addition to touch and push events.

Switch 20 could be used in any number of applications. For example, switch 20 could be installed in an automobile's steering wheel, console, center stack, or other surface and adapted to control HVAC, navigation, audio/video, and/or other functions. Switch 20 also could be used in appliances, home entertainment systems, other consumer electronic items, industrial equipment, and the like.

The foregoing description is provided to illustrate principles of the invention as claimed below. One skilled in the art would recognize that the embodiments described above could be modified in numerous ways without departing from the scope of the claims below.

The invention claimed is:

1. A multi-function switch apparatus comprising:
a proximity sensor;
a first touch sensor;
a first touch surface associated with said touch sensor, said first touch surface adapted for physical displacement in response to pressure applied thereto;
means for sensing proximity of a stimulus to said apparatus;
means for sensing touch by said stimulus to said touch surface;
means for sensing displacement of said first touch surface by said stimulus;
at least one additional touch sensor;
at least one additional touch surface, each said at least one additional touch surface corresponding to a respective at least one additional touch sensor;
means for sensing touch by said stimulus of said at least one additional touch surface; and
means for sensing displacement of said least one additional second touch surface by said stimulus.

2. The apparatus of claim 1 wherein said first touch sensor is a capacitive sensor having a control circuit adapted to distinguish between a change in sensor capacitance corresponding to a first capacitance threshold and a second capacitance threshold.

3. The apparatus of claim 2 wherein said first capacitance threshold is exceeded when said stimulus touches said touch surface and said second capacitance threshold is exceeded when said stimulus displaces said touch surface.

4. The apparatus of claim 1 further comprising means for backlighting said first touch surface.

5. The apparatus of claim 1 in combination with a display, wherein said display provides an output indicative of said stimulus being proximate said apparatus, touching said first touch surface, or displacing said first touch surface.

6. The apparatus of claim 5 wherein said display is remote from said first sensor.

7. A multi-function switch apparatus comprising:
a proximity sensor;
a first touch sensor;
a first touch surface associated with said touch sensor, said first touch surface adapted for selective physical displacement toward said first touch sensor in response to pressure applied to said first touch surface;
a control circuit coupled to said proximity sensor and said first touch sensor, said control circuit adapted to detect and distinguish among proximity of a stimulus to said proximity sensor, touch of said stimulus to said first touch surface, and displacement of said first touch surface toward said first touch sensor;
at least one additional touch sensor; and
at least one additional touch surface, each said additional touch surface corresponding to a respective said additional touch sensor, each said additional touch surface adapted for selective physical displacement toward the respective said additional touch sensor in response to pressure applied to said additional touch surface;
wherein said control circuit further is adapted to detect and distinguish among proximity of said stimulus to said apparatus, touch of said stimulus to said first touch surface, displacement of said first touch surface toward said first touch sensor, touch of said stimulus to any said additional touch surface, and displacement of said additional touch surface toward the corresponding said additional touch sensor.

8. The apparatus of claim 7 wherein said first touch sensor is a capacitive sensor, wherein said control circuit deems said stimulus to touch said first touch surface when said first sensor capacitance-to-ground changes from a first sensor baseline capacitance by at least a first capacitance threshold, and wherein said control circuit deems said first touch surface to be displaced toward said first touch sensor when said first sensor capacitance-to-ground changes from said first sensor baseline capacitance by at least a second capacitance threshold.

9. The apparatus of claim 7 wherein each said additional touch sensor is a capacitive sensor, wherein said control circuit deems said stimulus to touch the corresponding additional touch surface when said additional sensor capacitance-to-ground changes from an additional sensor baseline capacitance by at least a first corresponding capacitance threshold, and wherein said control circuit deems said additional touch surface to be displaced toward said additional touch sensor when said additional sensor capacitance-to-ground changes from said additional sensor baseline capacitance by at least a second corresponding capacitance threshold.

10. The apparatus of claim 7 wherein said control circuit is adapted to selectively designate only one of said first touch sensor and said at least one additional touch sensor as a dominant touch sensor at any given time.

11. The apparatus of claim 10 wherein said control circuit selectively designates as the dominant touch sensor the touch sensor corresponding to the touch surface that the control circuit most recently deemed to be touched or displaced with respect to said given time.

12. The apparatus of claim 10 wherein said control circuit selectively designates as the dominant touch sensor the touch sensor that the control circuit deems to exhibit the greatest change in capacitance from the corresponding sensor baseline capacitance at said given time.

13. The apparatus of claim 10 wherein said control circuit selectively designates as the dominant touch sensor the touch sensor corresponding to the first-to-be-actuated of a plurality of touch sensors actuated at said given time.

14. The apparatus of claim 10 wherein said apparatus is adapted to provide an output indicative of the state of only said dominant touch sensor at said given time.

15. A multi-function switch apparatus comprising:
a first touch sensor;
a first touch surface associated with said touch sensor, said first touch surface adapted for selective physical displacement toward said first touch sensor in response to pressure applied to said first touch surface;
a control circuit coupled to said first touch sensor, said control circuit adapted to detect and distinguish among proximity of a stimulus to said first touch surface, touch of said stimulus to said first touch surface, and displacement of said first touch surface toward said first touch sensor;
at least one additional touch sensor; and
at least one additional touch surface, each said additional touch surface corresponding to a respective said additional touch sensor, each said additional touch surface adapted for selective physical displacement toward the respective said additional touch sensor in response to pressure applied to said additional touch surface;
wherein said control circuit further is adapted to detect and distinguish among proximity of said stimulus to said first touch surface, touch of said stimulus to said first touch surface, displacement of said first touch surface toward said first touch sensor, touch of said stimulus to any said additional touch surface, and displacement of said additional touch surface toward the corresponding said additional touch sensor.

16. The apparatus of claim 15 wherein said first touch sensor is a capacitive sensor, wherein said control circuit deems said stimulus to touch said first touch surface when said first sensor capacitance-to-ground changes from a first sensor baseline capacitance by at least a first capacitance threshold, wherein said control circuit deems said first touch surface to be displaced toward said first touch sensor when said first sensor capacitance-to-ground changes from said first sensor baseline capacitance by at least a second capacitance threshold, and wherein said control circuit deems said stimulus to be proximate said first surface when said first sensor capacitance-to-ground changes from said first baseline capacitance by at least a third capacitance threshold.

17. The apparatus of claim 15 wherein each said additional touch sensor is a capacitive sensor, wherein said control circuit deems said stimulus to touch the corresponding additional touch surface when said additional sensor capacitance-to-ground changes from an additional sensor baseline capacitance by at least a first corresponding capacitance threshold, and wherein said control circuit deems said additional touch surface to be displaced toward said additional touch sensor when said additional sensor capacitance-to-ground changes from said additional sensor baseline capacitance by at least a second corresponding capacitance threshold.

18. The apparatus of claim 15 wherein said control circuit is adapted to selectively designate only one of said first touch sensor and said at least one additional touch sensor as a dominant touch sensor at any given time.

19. The apparatus of claim 18 wherein said control circuit selectively designates as the dominant touch sensor the touch sensor corresponding to the touch surface that the control circuit most recently deemed to be touched or displaced with respect to said given time.

20. The apparatus of claim 18 wherein said control circuit selectively designates as the dominant touch sensor the touch sensor that the control circuit deems to exhibit the greatest change in capacitance from the corresponding sensor baseline capacitance at said given time.

21. The apparatus of claim 18 wherein said control circuit selectively designates as the dominant touch sensor the touch sensor corresponding to the first-to-be-actuated of a plurality of touch sensors actuated at said given time.

22. The apparatus of claim 18 wherein said apparatus is adapted to provide an output indicative of the state of only said dominant touch sensor at said given time.

* * * * *